US006485783B1

(12) United States Patent
Bailey et al.

(10) Patent No.: US 6,485,783 B1
(45) Date of Patent: Nov. 26, 2002

(54) CHEMICAL VAPOR DEPOSITION SYSTEM

(75) Inventors: Robert J. Bailey, Santa Cruz; Lisa H. Michael, Palo Alto; Thomas E. Kane, Santa Cruz, all of CA (US)

(73) Assignee: ASML US, Inc., Scotts Valley, CA (US)

( * ) Notice: Subject to any disclaimer, the term of this patent is extended or adjusted under 35 U.S.C. 154(b) by 41 days.

(21) Appl. No.: 09/704,644

(22) Filed: Nov. 1, 2000

Related U.S. Application Data

(62) Division of application No. 09/480,730, filed on Jan. 6, 2000, now Pat. No. 6,206,933.
(60) Provisional application No. 60/130,783, filed on Apr. 23, 1999.

(51) Int. Cl.[7] ............................................. C23C 16/06
(52) U.S. Cl. ................... 427/248.1; 427/250; 427/251; 427/255.4; 427/255.5
(58) Field of Search ............................ 427/248.1, 250, 427/251, 255.4, 255.5; 118/715, 718

(56) References Cited

U.S. PATENT DOCUMENTS

| | | | | |
|---|---|---|---|---|
| 4,834,020 A | | 5/1989 | Bartholomew et al. | ...... 118/719 |
| 5,837,385 A | * | 11/1998 | Schaeffer et al. | ........... 148/277 |
| 5,916,378 A | * | 6/1999 | Bailey et al. | ............... 148/243 |

* cited by examiner

Primary Examiner—Timothy Meeks

(57) ABSTRACT

A chemical vapor deposition (CVD) system is provided for processing a substrate 110. The system 100 includes a heated muffle 115, a chamber 120 having an injector assembly 130 for introducing chemical vapor to process the substrate 110, and a belt 105 for moving the substrate through the muffle and chamber. The belt 105 has an oxidation-resistant coating 175 to reduce formation of deposits thereon. The coating 175 is particularly useful for resisting formation of chromium oxides on belts made from a chromium-containing alloy. In one embodiment, the oxidation-resistant coating 175 comprises a securely-adhered oxide layer 185 that is substantially free of transition metals. Preferably, the oxidation-resistant coating 175 comprises aluminum oxide. More preferably, the coating 175 comprises an aluminum oxide layer 185 securely adhered over a nickel aluminide layer 180.

17 Claims, 2 Drawing Sheets

CHEMICAL VAPOR DEPOSITION SYSTEM

CROSS REFERENCE TO RELATED APPLICATIONS

This application is a divisional application of U.S. patent application Ser. No. 09/480,730, filed Jan. 6, 2000, now U.S. Pat. No. 6,206,933 which claims priority from U.S. Provisional Patent Application Serial No. 60/130,783 filed Apr. 23, 1999, both of which are incorporated herein by reference.

FIELD OF THE INVENTION

The present invention relates generally to chemical vapor deposition systems, and more particularly to a belt-driven atmospheric chemical vapor deposition system having a belt with an oxidation-resistant coating to reduce formation of deposits on the belt and reactor components.

BACKGROUND OF THE INVENTION

Chemical vapor deposition (CVD) systems or reactors are well known and widely used to deposit or grow thin films of various compositions upon surfaces of substrates. For example, CVD systems are commonly used to deposit dielectric, passivation and dopant layers upon semiconductor wafers. CVD systems operate by introducing a process gas or chemical vapor into a deposition chamber in which a substrate to be processed has been placed. The gaseous source chemicals pass over the substrate, are adsorbed and react on the surface of the substrate to deposit the film. Various inert carrier gases may also be used to carry a solid or liquid source into the deposition chamber in a vapor form. Typically, the substrate is heated from 200 to 900° C. to initiate the reaction.

One type of CVD system used in semiconductor manufacturing is an atmospheric pressure chemical vapor deposition system (hereinafter APCVD system). APCVD systems are described in, for example, U.S. Pat. No. 4,834,020, to Bartholomew et al., which is incorporated herein by reference. In an APCVD system, a deposition chamber is maintained at atmospheric pressure while gaseous source chemicals are introduced to react and deposit a film on the substrate. A common embodiment of the APCVD system uses a belt or conveyor to move the substrates through the deposition chamber during the deposition process. Because this design allows uninterrupted processing of substrates, and because APCVD systems generally provide a higher rate of film growth than, for example, low pressure CVD systems in which the chamber must be evacuated prior to each deposition process, belt-driven APCVD systems typically provide a much greater substrate throughput.

Referring to FIG. 1, a conventional belt-driven APCVD system 20 typically includes an endless wire belt 25 for transporting substrates 30 at elevated temperatures through a process muffle 35 having a series of chambers 40, each chamber having a process gas injector 45 for depositing a layer (not shown) on the substrates. The substrates 30 on the belt 25 are heated by heaters 50 below a floor 55 of the process muffle 35. To provide a film having a uniform thickness across a substrate 30, and from substrate to substrate, the substrates must be heated uniformly during the deposition process. Thus, there must be good thermal contact between the substrates 30 and the belt 25, and between the belt and the muffle floor 55.

A shortcoming of conventional APCVD systems is that deposition occurs not only on the substrates, but also on components of the system itself. One problem caused by deposits on the APCVD system components is that they tend to chip or flake, generating particles that can contaminate the substrates. To ensure uniform and repeatable processing of the substrates, these deposits must be periodically removed from the system components. In particular, to uniformly heat the substrates in order to obtain consistently uniform films, the deposits must be removed from the belt and the muffle floor to provide flat contact surfaces between the substrates and the belt and between the belt and the muffle floor. Furthermore, the floor of the muffle directly below each deposition chamber typically includes a number of perforations through which a purge gas is introduced to inhibit film deposition on the back sides of processed substrates. If these perforations become clogged over time by CVD deposits, there is an insufficient flow of purge gas through the perforations and backside deposition on the substrates can occur.

Thus, there is a need for an APCVD system that reduces the generation of particles and reduces the accumulation of deposits on the APCVD system components generally and in particular on the belt and the muffle floor.

An additional liability of conventional APCVD systems constructed from chromium-containing alloys including stainless steels and many nickel-based alloys is associated with the tendency of these alloys to form protective chromium oxide surface layers that give these alloys their desirable oxidation resistance. The chromium oxide surface layer that forms on these alloys after extended service is known to generate gaseous chromium-containing compounds when employed in APCVD systems; these compounds condense on processed substrates resulting in chromium contamination.

Several approaches have been attempted to reduce the build up of deposits on the belt. One generally known approach, shown in FIG. 1, uses a belt cleaning mechanism 60 to continually clean the belt 25 during operation of the APCVD system. The belt cleaning mechanism 60 has an etch muffle 65 below the process muffle 35. After exiting the chambers 30 and the process muffle 35 the belt 25 enters the etch muffle 65 in which gaseous hydrous hydrogen fluoride (HF) in a nitrogen carrier gas (typically an azeotropic concentration) is passed through the belt, to react with and etch deposits on the belt. The belt 25 is then passed through an ultrasonic bath 70 of flowing deionized water, in which agitation removes etch products and particles from the belt. Finally, before reentering the process muffle 35, the belt 25 passes through an air knife 75 and an infrared dryer 80 to dry the belt.

Although the above approach keeps the belt relatively free of built-up deposits, the muffle floor 55 eventually accumulates deposits to such a degree that nonuniform heating of the substrate occurs, causing poor film uniformity on substrates, and/or the purge perforations to become logged. When this occurs, the muffle floor must be cleaned, and an HF cleaning procedure, commonly referred to as muffle etch, has been developed for this purpose. This procedure requires cooling the process muffle to near-room temperatures and dismantling the system to gain access to the muffle floor region. Typically, the procedure requires the replacement of the injector assemblies by HF dispensing tanks. These tanks expose the muffle floor to aqueous or gaseous hydrous HF that removes the accumulated material. The frequency of these muffle etches is dependent on several factors including the type and amount of chemicals used and the temperature of the deposition chamber. Typically, for conventional APCVD systems used to process semiconductor wafers the mean time between muffle etches (MTBME)

is on the order of every one to two hundred hours. This need for frequent, invasive and time consuming cleaning limits the otherwise excellent substrate throughput capabilities of APCVD systems.

Accordingly, there is a need for an APCVD system, and a method of operating the system, that reduces the formation of deposits on the system components in general, and in particular on the belt and the muffle floor. There is also a need for an APCVD system that increases the MTBME, thereby increasing substrate throughput. There is a further need for a method of reducing the generation of gaseous metal-containing compounds from the interior surfaces of the metal components in APCVD systems.

The present invention provides a solution to these and other problems, and offers other advantages over the prior art.

SUMMARY OF THE INVENTION

An objective of the present invention is to provide an improved chemical vapor deposition (CVD) system and method for processing substrates that decreases generation of particles and increases the mean time between muffle etches (MTBME) over conventional CVD systems and methods by reducing the formation of deposits on interior system components.

In one embodiment, the CVD system is a belt-driven atmospheric chemical vapor deposition system (APCVD system), and the substrates are semiconductor wafers. The APCVD system includes a heated muffle, one or more chambers having injector assemblies for introducing chemical vapor therein to process the substrate, and a belt for moving the substrate through the muffle and chambers. The belt and/or adjacent reactor components have an oxidation-resistant coating to reduce formation of deposits on the belt and other adjacent system components. The behavior is a consequence of the absence of chromium on the surface of the coated belt and system components due to the coating process. The oxidation-resistant coating is particularly useful for resisting formation of volatile chromium-containing species that form at the surface of many chromium-containing alloys, by preventing the formation of a native chromium oxide on the surface of these alloys. In one version, the oxidation-resistant coating includes a layer of nickel aluminide. The nickel aluminide can be either $NiAl_3$, $Ni_2Al_3$ or both, depending the temperature at which it is formed. Preferably, the oxidation-resistant coating also includes a stable, adherent, oxide layer, such as aluminum oxide, that is substantially free of transition metals. More preferably, the oxidation-resistant coating has a mean thickness of at least 5 $\mu$m.

The nickel aluminide layer can be formed by packing a powder consisting of an aluminum alloy, an activator and an inert powder around the belt, or CVD system component and heating the powder and the belt or component to diffuse the aluminum into a surface of the belt. Preferably, the powder consists of aluminum, $NH_4Cl$ and alumina. The aluminum oxide layer is formed by (i) heating the belt to a first temperature while flowing nitrogen, (ii) switching from nitrogen to hydrogen and flowing hydrogen while heating the belt to a second higher temperature, and (iii) holding the belt at the second temperature in a hydrogen atmosphere for a predetermined period of time to oxidize aluminum in the nickel aluminide layer on the belt or system component.

In another aspect, the invention is directed to a method of operating a belt-driven APCVD system to deposit a film on a surface of a substrate. In the method, a belt is provided, the belt made with a chromium-containing alloy and having an oxidation-resistant coating on a surface of the belt to resist the formation of chromium oxides. The substrate is placed on the belt, and the belt moved to transport the substrate into a deposition chamber. Chemical vapors are injected into the chemical vapor deposition chamber where they react to deposit the film on the surface of the substrate. In one embodiment, the step of providing a belt having an oxidation-resistant coating includes the step of providing a belt having a securely-adhered oxide layer that is substantially free of transition metals. Preferably, the step of providing a belt having an oxidation-resistant coating includes the step of providing a belt having an aluminum oxide layer. More preferably, the oxidation-resistant coating includes an aluminum oxide layer securely adhered to the nickel aluminide layer.

In yet another aspect, the invention is directed to a CVD system having means for reducing formation of deposits on a surface of a belt and adjacent components so that a mean time between muffle etches (MTBME) is increased. Preferably, the MTBME is increased by a factor of at least 3 over a system not having a means for reducing formation of deposits on the surface of the belt. More preferably, the MTBME is increased by a factor of 10 over a system not having a means for reducing formation of deposits on the surface of the belt. In one embodiment, the belt is made with a chromium-containing nickel alloy and the means for reducing formation of deposits on the belt includes an oxidation-resistant coating that prevents formation of thermal chromium oxide.

BRIEF DESCRIPTION OF THE DRAWINGS

These and various other features and advantages of the present invention will be apparent upon reading of the following detailed description in conjunction with the accompanying drawings, where.

DETAILED DESCRIPTION OF THE INVENTION

Figure 2:
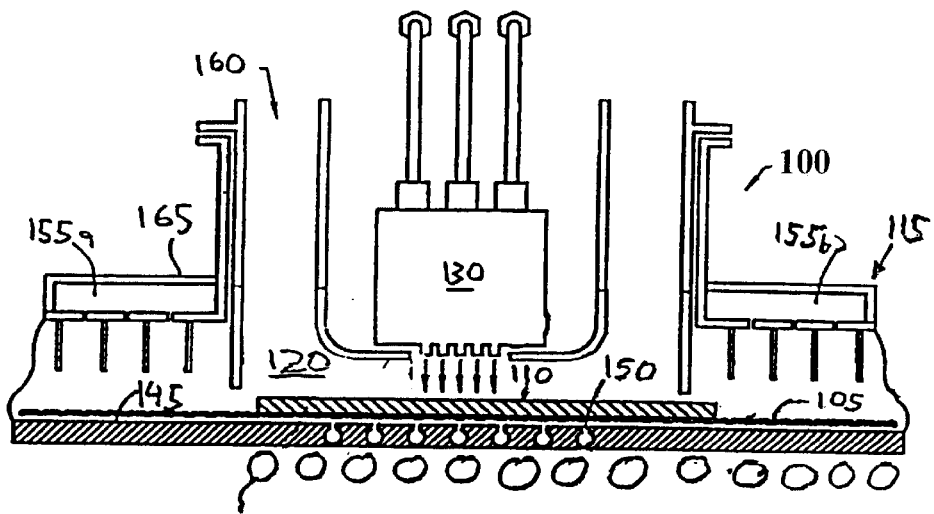
FIG. 2 is a partial sectional side view of a belt-driven APCVD system having a belt with an embodiment of the oxidation-resistant coating according to the present invention.

The present invention provides an apparatus and method for uniformly and consistently depositing or growing a layer of material on a series of sequentially processed substrates while reducing deposition on components of the apparatus and a resultant generation of contaminant compounds from the deposits. The apparatus and method according to the present invention are particularly useful for depositing a layer of material on substrates, such as semiconductor wafers, using a belt-driven atmospheric chemical vapor deposition system (APCVD system). A schematic of an exemplary APCVD system according to the present invention is shown in FIG. 2. The particular embodiment of the APCVD system shown herein is provided only to illustrate the invention and should not be used to limit the scope of the invention.

Figure 1:
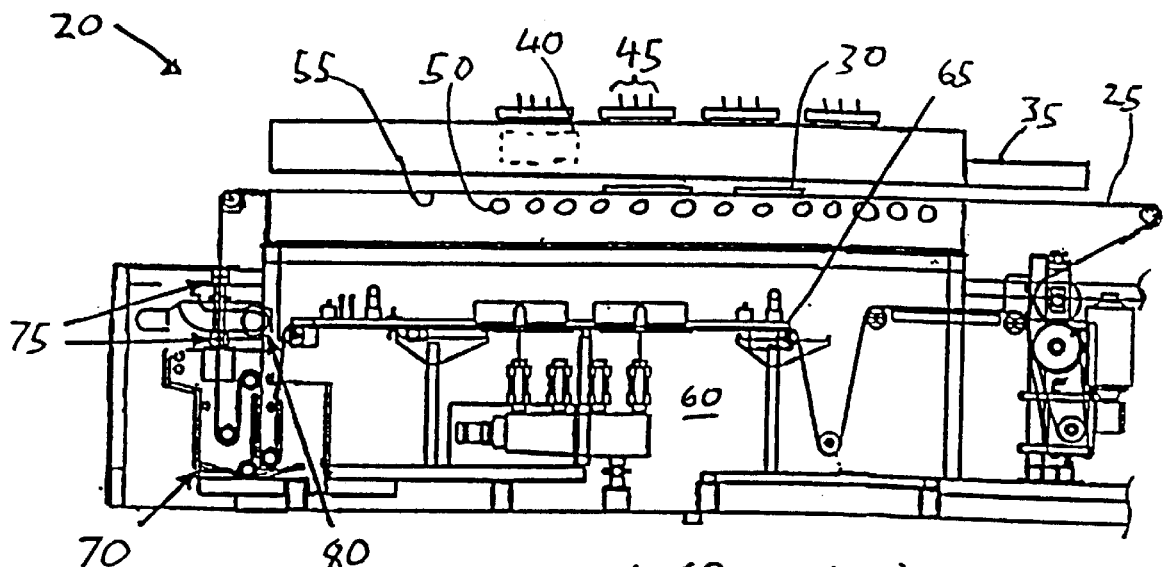
FIG. 1 (prior art) is a schematic side view of a belt-driven APCVD system.

Referring to FIG. 2, the APCVD system 100 generally includes an endless wire belt 105 for moving a substrate 110 through a process muffle 115 having one or more chambers 120. Each chamber has an injector assembly 130 for introducing a process gas or chemical vapor to process the substrate. Heating elements 140 are provided below a floor 145 of the process muffle 115 to heat the substrates 110 in the process muffle. The floor 145 of the process muffle 115 has a number of purge holes 150 through which an inert purge gas, such as nitrogen, helium or argon flows into the chambers 120. In addition, two sets of plenums 155a, 155b, on either side of each chamber 120 direct a flow purge gas downward toward the floor 145 of the muffle 115. This flow forms gas curtains (not shown) that substantially prevent any chemical vapors from traveling to adjoining chambers (not shown) or exiting the process muffle 115. An exhaust system 160 exhausts spent chemical vapors and purge gas from a top 165 of the process muffle 115. Optionally, the APCVD system 100 can further include a belt cleaning mechanism 60 as shown in FIG. 1 and as described above.

Generally, one or more of the belt 105, the process muffle 115 and the chambers 120 are made of a nickel-based high temperature superalloy, such as Inconel® or Haynes® 214. These superalloys are able to withstand high temperatures and exhibit good forming and welding characteristics. Inconel® is preferred because of its ability to withstand cyclic heating and cooling without failure or loss of desirable mechanical properties. More preferably, Inconel® 601, which has a nominal composition (weight percent) of about 60% Ni, 22% Cr, 17% Fe, and 1% Al, is used.

These superalloys normally exhibit good high-temperature oxidation and corrosion resistance by virtue of a thermal surface oxide layer that spontaneously forms during exposure to hot oxidizing atmospheres. In chromium-containing alloys the surface oxide layer typically includes chromium oxide ($Cr_2O_3$), which is known to generate metastable chromium-containing gaseous compounds in hot oxidizing atmospheres. Formation of these compounds is prevented if an impermeable, oxidation-resistant, chromium-free coating can be applied to surfaces of the alloys. Thus, in accordance with the present invention, an oxidation-resistant coating 175 is formed on the surface of the belt 105.

Preferably, the oxidation-resistant coating 175 is pore-free and conformal on all wire surfaces of the belt 105 to substantially prevent oxidation of the underlying alloy. For example, when the belt 105 is made with Inconel® 601, and contains chromium as described above, the oxidation-resistant coating 175 is selected to reduce the formation of a chromium-containing thermal oxide. It will be appreciated that the oxidation resistant coating and the methods described herein may also be applied to other components of the CVD system made from Chromium containing Nickel alloys. Preferably, the oxidation-resistant coating 175 has a mean thickness of from about 3 to about 15 $\mu$m, and more preferably, a mean thickness of at least 5 $\mu$m.

Figure 3:
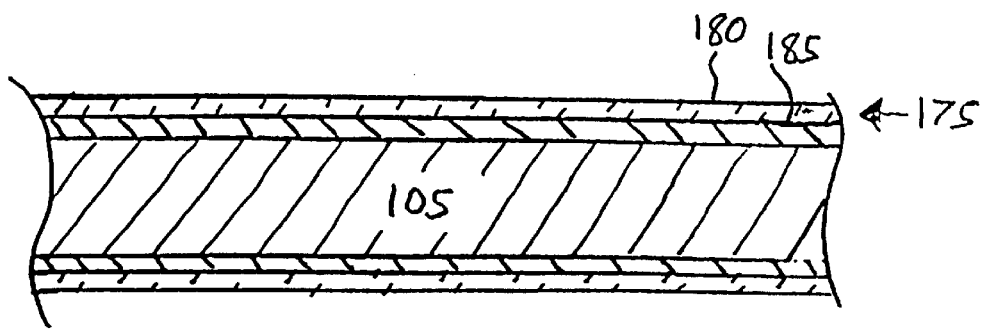
FIG. 3 is a partial sectional side view of a belt having an embodiment of an oxidation-resistant coating according to the present invention.

Referring to FIG. 3, in one embodiment, the oxidation-resistant coating 175 includes a layer of nickel aluminide 180. The nickel aluminide can be either $NiAl_3$, $Ni_2Al_3$ or both, depending upon the temperature at which it is formed. The nickel aluminide layer 180 resists the formation of thermal chromium oxide by forming a tightly adherent oxidation barrier that isolates the underlying chromium-containing alloy. In one version of this embodiment, the nickel aluminide layer 180 is preoxidized in a controlled environment to provide an aluminum oxide layer 185, $AlO_2$ or $Al_2O_3$, that is substantially free of all transition metals from the underlying belt 105.

Figure 4:
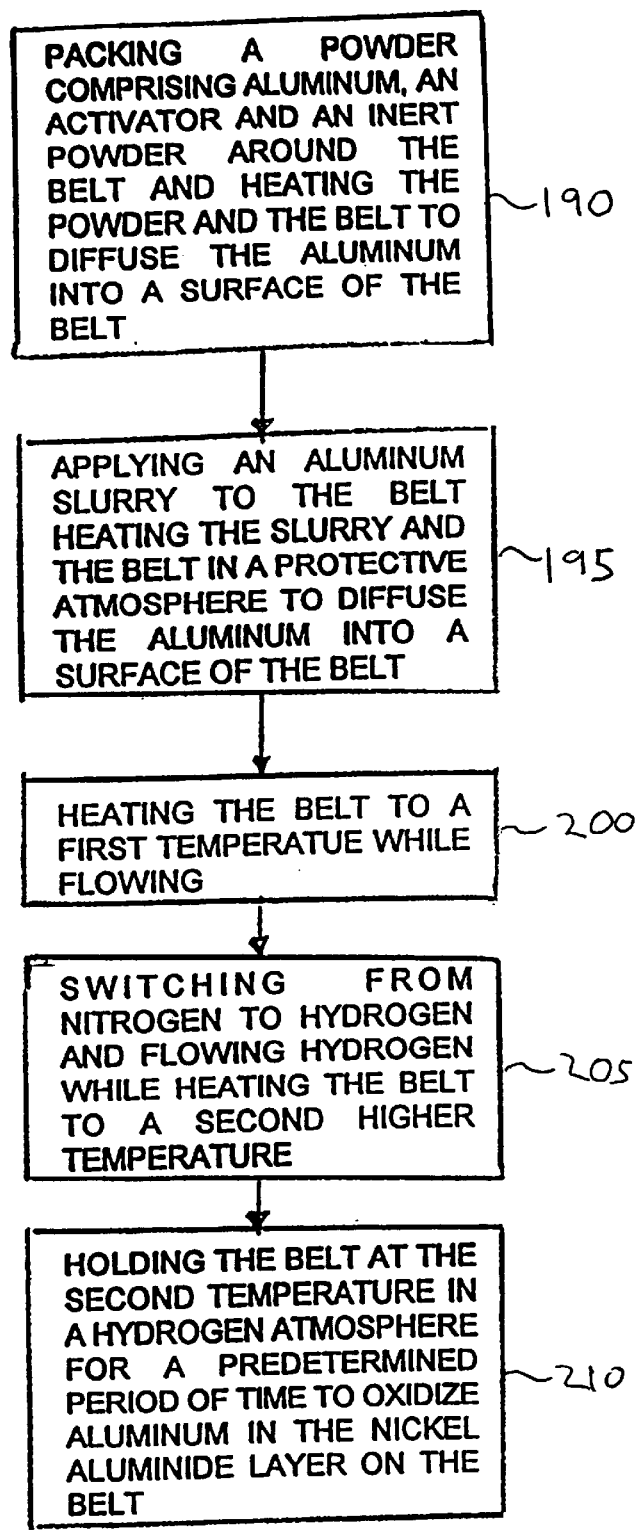
FIG. 4 is a flowchart showing an embodiment of a process for manufacturing a belt with an oxidation-resistant coating according to the present invention.

A process for forming the oxidation-resistant coating 175 will now be described with reference to FIG. 4. FIG. 4 is a flowchart showing an embodiment of a process for forming an oxidation-resistant coating 175 having a nickel aluminide layer 180 and an aluminum oxide layer 185 on a belt 105 made with a nickel-based superalloy. In an aluminization step 190, aluminum is alloyed into the surface of the belt 105 using a pack cementation process. In this process, a powder comprising an aluminum alloy, an activator and an inert powder is packed around the belt 105, and the powder and the belt heated to cause the aluminum to diffuse into the surfaces of the belt. Generally, the activator is a halide, such as sodium fluoride (NaF) or ammonium chloride ($NH_4Cl$), and inert powder is alumina ($Al_2O_3$). When heated to a sufficiently high temperature (greater than about 640° C. but not so high as to cause the metal of the belt 105 to soften) the activator reacts with the aluminum alloy to form gaseous aluminum halides. These gaseous aluminum halides then condense on the surfaces of the belt 105, where they are reduced to elemental aluminum and diffused into the belt to form the nickel aluminide layer 180.

Alternatively, or in addition to the above step, the nickel aluminide layer 180 can be directly formed on the belt 105 by liquid phase reactions using a slurry in a second aluminization step 195. In the slurry process, a layer of aluminum is painted or sprayed directly on the surfaces of the belt 105. The belt 105 is then heated in a protective atmosphere to cause the aluminum to diffuse into the surfaces of the belt. The heating may be accomplished, for example, using an argon or hydrogen plasma spray. Preferably, after the completion of one or more of the preceding aluminization steps 190, 195, the nickel aluminide layer 180 has a mean thickness of from about 3 to about 15 $\mu$m, and more preferably a mean thickness of from about 5 $\mu$m.

At this point, the process of forming an oxidation-resistant coating 175 can be stopped, and the belt 105, with the nickel aluminide layer 180 thereon, placed in service. This is because the concentration of aluminum in the nickel aluminide layer 180 will cause a stable aluminum oxide layer 185 to form when it is exposed to an oxidizing atmosphere at elevated temperatures. However, in a preferred embodiment, the nickel aluminide layer 180 is pre-oxidized in a controlled environment to promote the formation of an aluminum oxide layer 185 while substantially preventing oxidation of the nickel. A process for accomplishing this is described below.

Referring again to FIG. 4, the belt 105, with the nickel aluminide layer 180 thereon, is heated in a first heating step 200 to a first temperature of about 300° C., in a flowing nitrogen environment. The nitrogen flow is then replaced with a dry hydrogen flow and, in a second heating step 205 the belt 105 is ramped up to a second temperature of about 700° C. Temperatures of from about 500 to about 800° C. are acceptable, but 700° C. is preferred as offering the highest oxidation rate without significantly softening the nickel-based alloy of the belt 105. Next, in an oxidation step 210, the belt 105 is maintained for approximately four hours at the second temperature (700° C.) in a wet hydrogen environment having a dewpoint of approximately 0° C. Finally, in a cool down step (not shown), the environment is changed back to a dry hydrogen, and the temperature dropped to about 600° C., at which point the dry hydrogen is replaced by nitrogen and the belt 105 cooled to room temperature.

EXAMPLES

The following examples are provided to illustrate advantages of certain embodiments of the present invention, and are not intended to limit the scope of the invention in any way.

Example 1

In a first example, a belt 105 made with Inconel® 601 was treated in accordance with the present invention to provide an oxidation-resistant coating 175 including a nickel aluminide layer 180 and an aluminum oxide layer 185 and having a mean thickness of about 5 μm. The belt 105 was then installed in an APCVD system 100 and various processes run to deposit dielectric, passivation, and dopant layers on semiconductor wafers at temperatures ranging from 450 to about 550° C. The typical MTBME for this APCVD system 100 in this type of service using an uncoated belt was approximately 150 hours. Although, the APCVD system 100 was withdrawn from service after 330 hours for reasons unrelated to the belt 105, subsequent measurements of deposits on the belt and particles accumulated on the muffle floor 145 revealed there was no need for a muffle etch at that time. Thus, this example illustrates that the oxidation-resistant coating 175 of the present invention can increase the MTBME by at least 120% over that of an uncoated belt.

Example 2

In a second example, another belt 105, also made with Inconel® 601, was provided with an oxidation-resistant coating 175 having a pre-oxidized nickel aluminide layer 180 with a mean thickness of about 5 μm. The belt 105 was then installed in another APCVD system 100 at a customer's site and the APCVD system operated to deposit an undoped layer of glass on semiconductor wafers using TEOS (tetraethyl orthosilicate) at a temperature of about 400° C. The typical MTBME for this APCVD system 100 using a standard uncoated belt was approximately 250 hours. With the coated belt 105 installed, the first muffle etch was performed at 500 hours at the request of the customer, although, again, there was no evidence that it was required.

Example 3

In a third example, the same belt 105 and APCVD system 100 used in Example 2 were allowed to operate 1000 hours before inspection, and again there was no evidence that a muffle etch was required. The typical MTBME for this system using a standard uncoated belt was 250 to 280 hours. The APCVD system 100 with the belt 105 having the oxidation-resistant coating 175 continued to operate for over 2000 hours without the need for a muffle etch, at which time a muffle etch was performed for reasons not related to the belt, film uniformity or particles. This example illustrates an increase between in the MTBME of more than 600% over that of the uncoated belt. Moreover, this example also illustrates that the oxidation-resistant coating 175 is capable of withstanding the rigors of the continuous CVD operation and the rough handling of the muffle etch procedure.

As demonstrated by the above examples, an APCVD system 100 having a belt 105 with an oxidation-resistant coating 175 according the present invention increases the MTBME, thereby increasing the availability of the APCVD system, and decreasing the cost of owning and operating the APCVD system on a per substrate basis. In the highly competitive field of semiconductor manufacturing these are significant advantages, which are not provided by conventional APCVD systems.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, although the preferred embodiment described herein is directed to an oxidation-resistant coating on the belt of an APCVD system used for processing semiconductor substrates, it will be appreciated by those skilled in the art that the teachings of the present invention can be adapted to other components of CVD systems used for processing different substrates. Thus, the scope of the appended claims should not be limited to the preferred embodiments described herein.

What is claimed is:

1. A method of operating a chemical vapor deposition system to deposit a film on a surface of a substrate, the method comprising steps of:
    (a) providing a belt having an oxidation-resistant coating comprising a nickel aluminide layer on a surface of the belt to resist the formation of deposits thereon;
    (b) placing the substrate on the belt;
    (c) moving the belt to transport the substrate into a chemical vapor deposition chamber;
    (d) injecting chemical vapors into the chemical vapor deposition chamber; and
    (e) reacting the chemical vapors in the chemical vapor deposition chamber to deposit the film on the surface of the substrate.

2. A method according to claim 1 wherein step (a) comprises the step of providing a belt having an oxidation-resistant coating including a securely adhered oxide layer that is substantially free of transition metals.

3. A method according to claim 1 wherein step (a) comprises the step of providing a belt having an oxidation-resistant coating including an aluminum oxide layer.

4. A method according to claim 3 wherein step (a) comprises the step of providing a belt having an oxidation-resistant coating further including an aluminum oxide layer securely adhered to the nickel aluminide layer.

5. A method according to claim 1 wherein step (a) comprises the step of providing a belt having a chromium-containing alloy, and wherein the oxidation-resistant coating resists the formation of chromium oxides.

6. A method according to claim 5 wherein step of providing a belt having a chromium-containing alloy comprises the step of providing a nickel, iron and aluminum containing alloy.

7. A method according to claim 6 wherein the chromium-containing alloy has a composition in weight percent of 58.0–63.0% nickel, 21.0–25.0% chromium, 1.0–1.7% aluminum, iron as balance with a maximum of 0.10% carbon, 1.0% magnesium, 0.015% sulfur, 0.50% silicon, and 1.0% copper.

8. A method according to claim 6 wherein the chromium-containing alloy has a composition in weight percent of approximately 75% nickel, 16.0% chromium, 3.0% iron, 4.5% aluminum, a maximum of 0.5% magnesium, 0.2% silicon, 0.01% boron, 0.1% zirconium, and 0.01% yttrium, and 0.05% carbon.

9. A method according to claim 1 wherein the nickel aluminide layer comprises $NiAl_3$ or $Ni_2Al_3$.

10. A method according to claim 1 wherein step (a) comprises the step of providing a belt having an oxidation-resistant coating having a mean thickness of at least 5 μm.

11. A method of operating a chemical vapor deposition system to deposit a film on a surface of a substrate, the method comprising steps of:

(a) providing a muffle with at least one chamber with an injector assembly adapted to inject a chemical vapor into the chamber to process the substrates, a belt adapted to move the substrates to be processed through the muffle into the chamber, and an exhaust system adapted to exhaust spent chemical vapor from the muffle, at least one of the belt, the muffle or the exhaust system having an oxidation-resistant coating comprising a nickel aluminide layer so that formation of deposits thereon and generation of particles is reduced;

(b) placing the substrate on the belt;

(c) moving the belt to transport the substrate into a chemical vapor deposition chamber;

(d) injecting chemical vapors into the chemical vapor deposition chamber; and (e) reacting the chemical vapors in the chemical vapor deposition chamber to deposit the film on the surface of the substrate.

12. A method according to claim 11 wherein step (a) comprises the step of providing at least one of the belt, the muffle or the exhaust system having an oxidation-resistant coating including a securely adhered oxide layer that is substantially free of transition metals.

13. A method according to claim 11 wherein step (a) comprises the step of providing at least one of the belt, the muffle or the exhaust system having an oxidation-resistant coating including an aluminum oxide layer.

14. A method according to claim 11 wherein step (a) comprises the step of providing at least one of the belt, the muffle or the exhaust system having an oxidation-resistant coating including an aluminum oxide layer securely adhered to the nickel aluminide layer.

15. A method according to claim 11 wherein step (a) comprises the step of providing at least one of the belt, the muffle or the exhaust system having a chromium-containing alloy, and wherein the oxidation-resistant coating resists the formation of chromium oxides.

16. A method according to claim 11 wherein the nickel aluminide layer comprises $NiAl_3$ or $Ni_2Al_3$.

17. A method according to claim 11 wherein step (a) comprises the step of providing at least one of the belt, the muffle or the exhaust system having an oxidation-resistant coating having a mean thickness of at least 5 $\mu$m.

* * * * *